US008035198B2

(12) United States Patent
Ding et al.

(10) Patent No.: US 8,035,198 B2
(45) Date of Patent: Oct. 11, 2011

(54) THROUGH WAFER VIA AND METHOD OF MAKING SAME

(75) Inventors: Hanyi Ding, Essex Junction, VT (US); Alvin Jose Joseph, Willliston, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 12/188,229

(22) Filed: Aug. 8, 2008

(65) Prior Publication Data

US 2010/0032808 A1    Feb. 11, 2010

(51) Int. Cl.
*H01L 21/768*    (2006.01)
*H01L 23/538*    (2006.01)
(52) U.S. Cl. ............... 257/621; 257/774; 257/E23.174; 257/E21.597; 438/667
(58) Field of Classification Search ............... 257/621, 257/774, E21.597, E23.174; 438/667
See application file for complete search history.

(56) References Cited

U.S. PATENT DOCUMENTS

| | | | |
|---|---|---|---|
| 4,666,556 A | 5/1987 | Fulton et al. | |
| 4,690,729 A | 9/1987 | Douglas | |
| 5,933,748 A | 8/1999 | Chou et al. | |
| 5,998,292 A | 12/1999 | Black et al. | |
| 6,406,934 B1 | 6/2002 | Glenn et al. | |
| 6,836,020 B2 | 12/2004 | Cheng et al. | |
| 7,005,388 B1 | 2/2006 | Hopper et al. | |
| 7,056,813 B2 | 6/2006 | Morrow et al. | |
| 7,071,098 B2 | 7/2006 | Kirby et al. | |
| 7,224,051 B2 | 5/2007 | Farnworth et al. | |
| 7,259,454 B2 | 8/2007 | Tanida et al. | |
| 7,271,491 B1 | 9/2007 | Akram | |
| 7,276,787 B2 | 10/2007 | Edelstein et al. | |
| 2005/0248002 A1 | 11/2005 | Newman et al. | |
| 2006/0001174 A1* | 1/2006 | Matsui | 257/774 |
| 2006/0006539 A1* | 1/2006 | Matsui et al. | 257/758 |
| 2006/0105496 A1* | 5/2006 | Chen et al. | 438/106 |
| 2006/0118965 A1* | 6/2006 | Matsui | 257/774 |
| 2006/0154438 A1 | 7/2006 | Kishimoto et al. | |
| 2006/0197119 A1 | 9/2006 | Chinthakindi et al. | |
| 2006/0214298 A1 | 9/2006 | Huang et al. | |
| 2006/0275946 A1 | 12/2006 | MacNamara et al. | |
| 2007/0045779 A1 | 3/2007 | Hiatt | |
| 2007/0048896 A1 | 3/2007 | Andry et al. | |
| 2007/0190692 A1 | 8/2007 | Erturk et al. | |
| 2007/0196948 A1 | 8/2007 | Trezza | |
| 2007/0197018 A1 | 8/2007 | Chen et al. | |

(Continued)

OTHER PUBLICATIONS

U.S. Appl. No. 12/188,236, filed Aug. 8, 2008; Confirmation No. 4587; Customer No. 30449.

(Continued)

*Primary Examiner* — Eugene Lee
*Assistant Examiner* — Peniel M Gumedzoe
(74) *Attorney, Agent, or Firm* — Schmeiser, Olsen & Watts; Richard M. Kotulak

(57) ABSTRACT

A through wafer via structure. The structure includes: a semiconductor substrate having a top surface and an opposite bottom surface; and an array of through wafer vias comprising at least one electrically conductive through wafer via and at least one electrically non-conductive through wafer via, each through wafer via of the array of through wafer vias extending from the top surface of the substrate to between greater than halfway to and all the way to the bottom surface of the substrate. Also methods for fabricating the though wafer via structure.

30 Claims, 15 Drawing Sheets

U.S. PATENT DOCUMENTS

| | | | |
|---|---|---|---|
| 2008/0079131 A1* | 4/2008 | Kim et al. | 257/686 |
| 2008/0099870 A1 | 5/2008 | Wilson et al. | |
| 2009/0215237 A1 | 8/2009 | Disney et al. | |
| 2009/0244954 A1 | 10/2009 | Cannon et al. | |
| 2009/0267126 A1 | 10/2009 | Wang et al. | |
| 2011/0012196 A1 | 1/2011 | Williams et al. | |

OTHER PUBLICATIONS

U.S. Appl. No. 12/188,230, filed Aug. 8, 2008; Confirmation No. 4600; Customer No. 30449.

U.S. Appl. No. 12/188,236, filed Aug. 8, 2008; Confirmation No. 4618; Customer No. 30449.

U.S. Appl. No. 12/188,241, filed Aug. 8, 2008; Confirmation No. 4625; Customer No. 30449.

Notice of Allowance (Mail Date Oct. 30, 2009) for U.S. Appl. No. 12/188,230, filed Aug. 8, 2008; Confirmation No. 4600.

Office Action (Mail Date Apr. 28, 2011) for U.S. Appl. No. 12/188,241, filed Aug. 8, 2008.

Office Action (Mail Date Jul. 28, 2011) for U.S. Appl. No. 12/188,228—Filing Date Aug. 8, 2008.

* cited by examiner

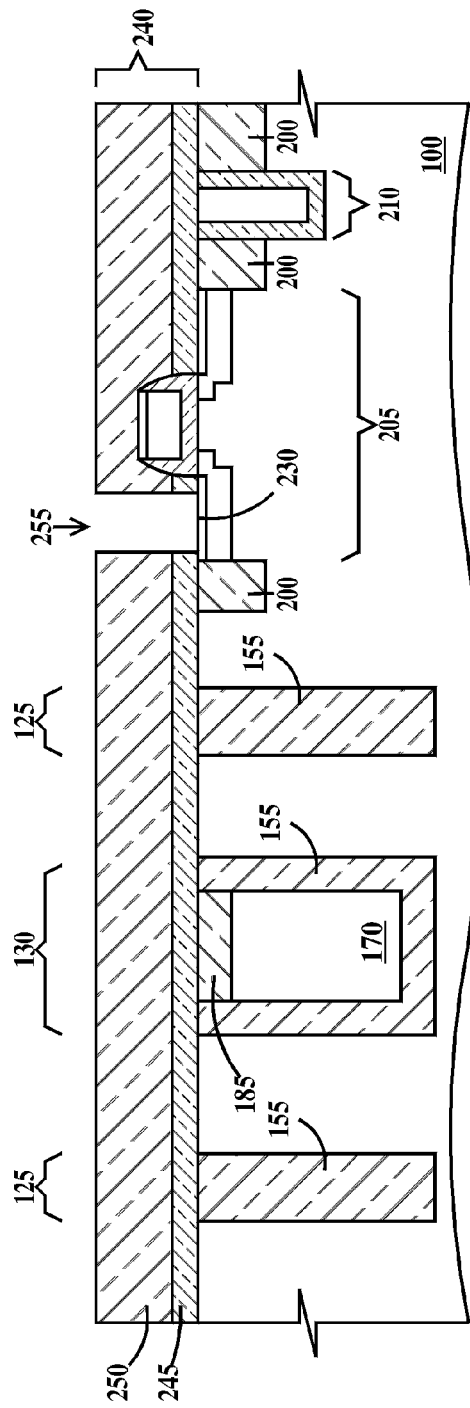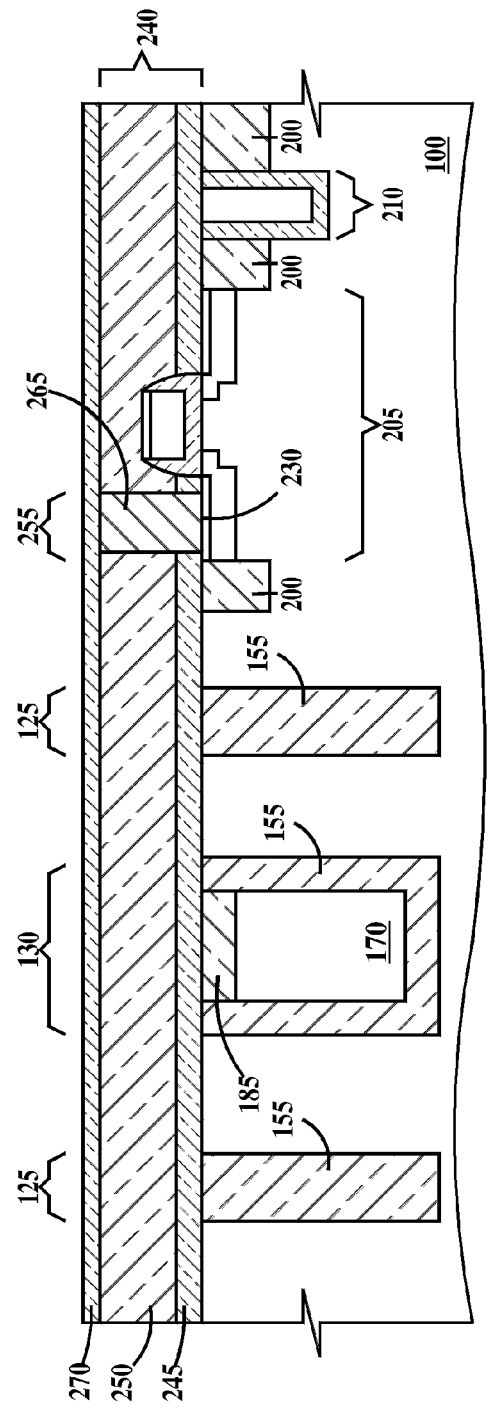
FIG. 1L
FIG. 1M

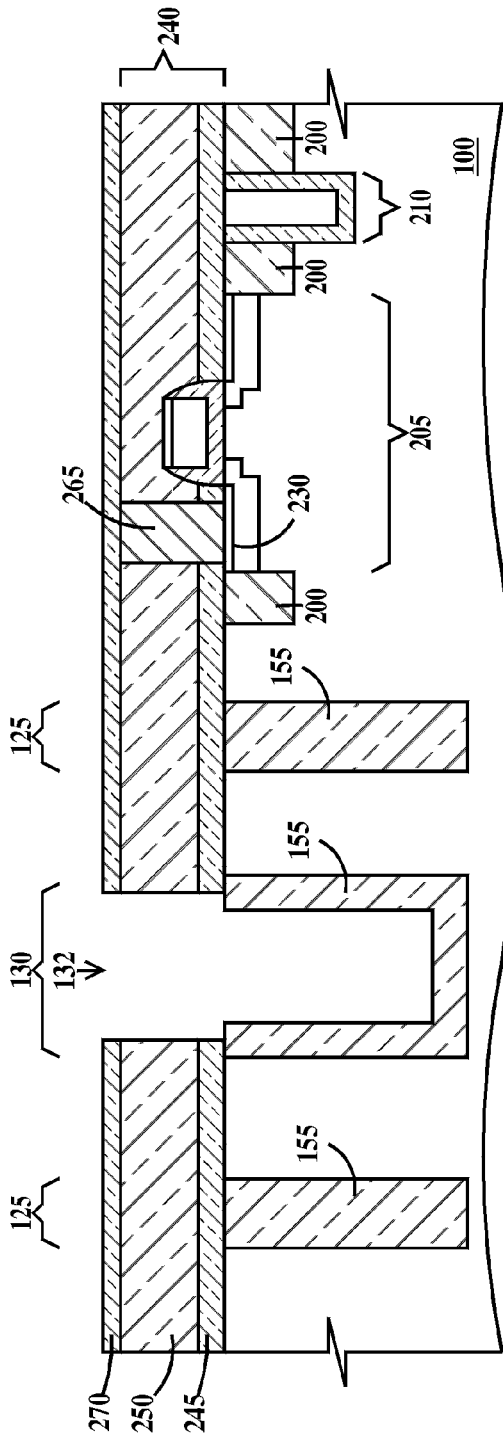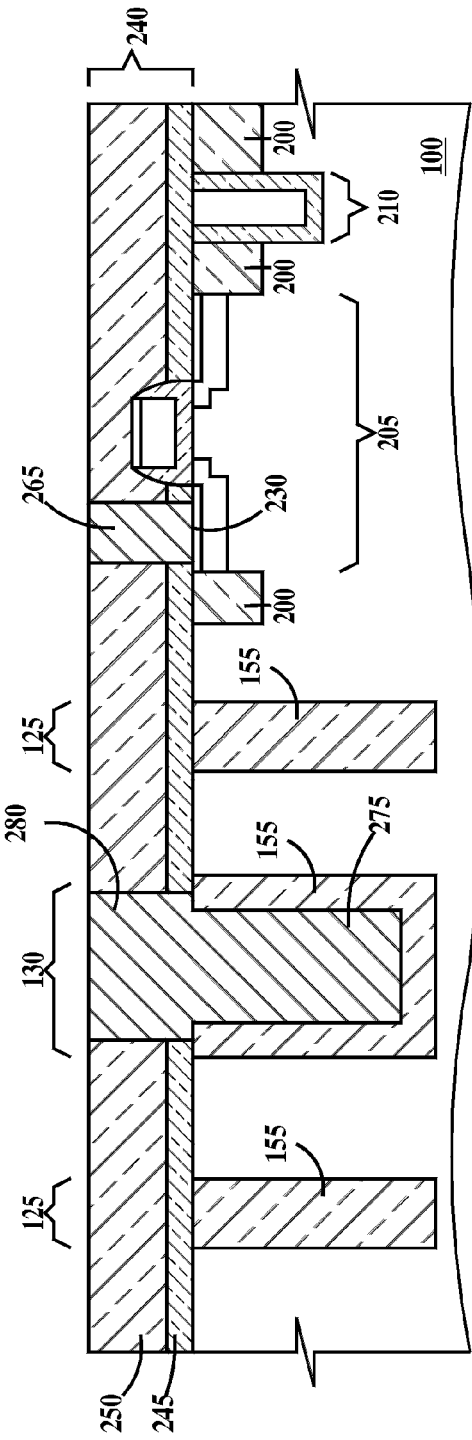
FIG. 1N
FIG. 1O

THROUGH WAFER VIA AND METHOD OF MAKING SAME

FIELD OF THE INVENTION

The present invention relates to the field of integrated circuit chips; more specifically, it relates to through wafer vias for use in integrated circuit chips and the method of fabricating the through wafer vias.

BACKGROUND OF THE INVENTION

To increase the density of devices using integrated circuit chips it is desirable to allow interconnections to be made to both the top and bottom surfaces of the integrated circuit chip. This requires formation of through wafer vias from the top to the bottom surface of the integrated chip that are compatible with carrying both high frequency and DC signals. Many existing through via schemes are either difficult to integrate into existing integrated circuit fabrication processes or result in unacceptable degradation of signals propagating from/to the front surface of the integrated circuit chip to/from the bottom surface of the integrated circuit chip. Accordingly, there exists a need in the art to overcome the deficiencies and limitations described hereinabove.

SUMMARY OF THE INVENTION

A first aspect of the present invention is a structure, comprising: a semiconductor substrate having a top surface and an opposite bottom surface; and an array of through wafer vias comprising at least one electrically conductive through wafer via and at least one electrically non-conductive through wafer via, each through wafer via of the array of through wafer vias extending from the top surface of the substrate to between greater than halfway to and all the way to the bottom surface of the substrate.

A second aspect of the present invention is a method, comprising: forming an array of through wafer vias comprising at least one electrically conductive through wafer via and at least one electrically non-conductive through wafer via through a semiconductor substrate having a top surface and an opposite bottom surface, each through wafer via of the array of through wafer vias extending from the top surface of the substrate to between greater than halfway to and all the way to the bottom surface of the substrate.

A third aspect of the present invention is a method, comprising: (a) forming a first trench and a second trench in a semiconductor substrate, the first and second trenches independently extending from a top surface of the substrate toward an opposite bottom surface of the substrate a distance less than a thickness of the substrate; (b) simultaneously completely filling the first trench with a dielectric material and forming a liner of the dielectric material on sidewalls of the second trench; (c) filling remaining space in the second trench with an electrically conductive material; and (d) thinning the substrate from the bottom surface of the substrate to form a new bottom surface of the substrate, the dielectric material of the first trench and the liner and electrically conductive material of the second trench exposed in the new bottom surface of substrate.

A fourth aspect of the present invention is a signal transmission line through a semiconductor substrate, the substrate having a top surface and an opposite bottom surface, comprising: a conductive through wafer via extending from the top surface of the substrate to the bottom surface of the substrate, sidewalls of the conductive through via electrically insulated from the substrate; and a non-conductive through via extending from the top surface of the substrate to between greater than halfway to and all the way to the bottom surface of the substrate, the nonconductive through via proximate to and separated from the conductive through wafer by a region of the substrate.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term through wafer via defines a structure that extends from a top surface of a substrate, through the substrate, to an opposite bottom surface of the substrate of the packaged integrated circuit or chip. A through wafer via according to the embodiments of the present invention may be electrically conductive or electrically non-conductive. Although in the description infra, both conductive and non-conductive (i.e., insulating) through vias are described and illustrated as extending from the top to the bottom surface of the chip, the present invention may be practiced where the conductive through via extends entirely through the chip, but the non-conductive only extends partially through the chip because one purpose of the non-conductive through vias is for isolation and not passing electrical signals between the top and bottom surfaces of the chip. An electrically conductive through via includes at least one electrically conductive element and may include non-electrically conductive elements. An electrically non-conductive through via includes at least one electrically non-conductive element and may include electrically conductive elements that are surrounded completely by electrically non-conductive elements. The "wafer" of through wafer via derives from the fact that the via is formed before integrated circuits have been singulated from a semiconductor substrate called a wafer. The term "three dimensional device" defines a device comprising two or more individual substrates electrically connected and in physical contact by being stacked one upon another.

Figure 1A:
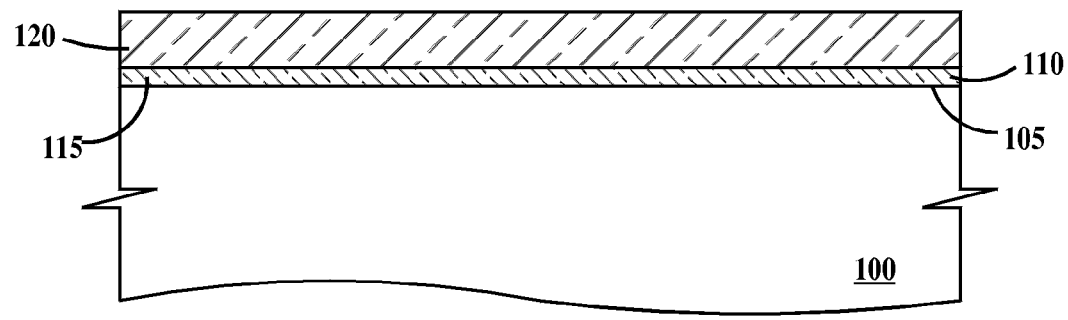
FIGS. 1A through 1O are cross-sectional drawings illustrating initial steps in the fabrication of an array of through wafer vias according embodiments of the present invention.

FIGS. 1A through 1O are cross-sectional drawings illustrating initial steps in the fabrication of an array of through wafer vias according embodiments of the present invention. In FIG. 1A, a semiconductor substrate 100 has a top surface 105. Formed on top surface 105 is a first dielectric layer 110.

Formed on a top surface 115 of first dielectric layer 110 is a second dielectric layer 120. First and second dielectric layers 110 and 120 are exemplary and there may be a few as one dielectric layer or more than two dielectric layers formed over top surface 105 of substrate 100. In one example, substrate 100 is a bulk silicon substrate. In one example first dielectric layer 110 is silicon dioxide and second dielectric layer 120 is silicon nitride.

Figure 1B:
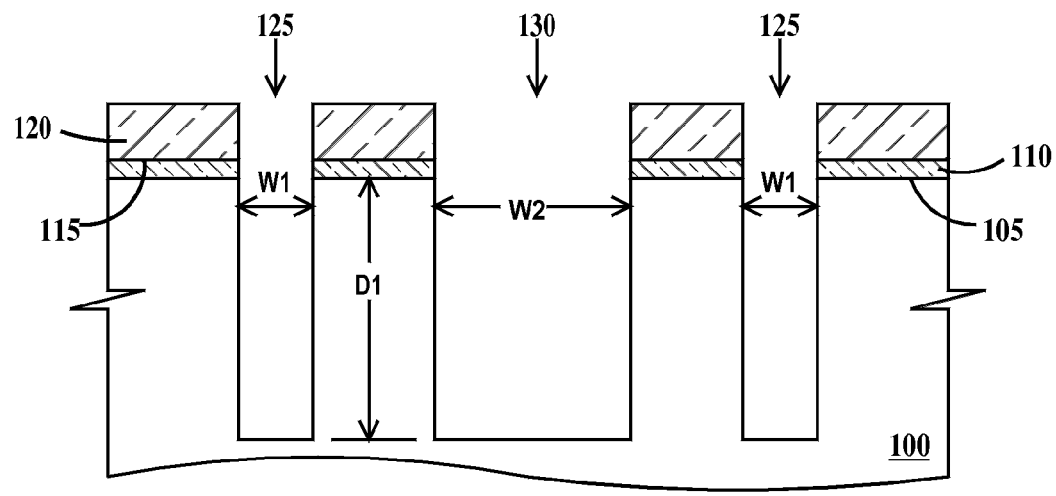

In FIG. 1B, trenches 125 and 130 are etched through first and second dielectric layers 110 and 120 and into substrate 100. Trenches 125 and 130 may be formed using a photolithographic/etching process. An exemplary photolithographic/etching process comprises (1) forming a photoresist layer on second dielectric layer 120, (2) forming openings in the photoresist layer by exposing the photoresist layer to actinic radiation through a patterned photomask and developing away either the exposed or unexposed regions of the photoresist, (4) etching through, the first and second dielectric layers using, for example, a reactive ion etch (RIE) process, (5) removing the patterned photoresist layer, and (6) etching substrate 100 using, for example, an RIE process using the pattern in the first and second dielectric layers as a patterned hardmask. Although trenches 125 and 130 are shown etched to the same depth in FIG. 1B, trenches 125 and 130 may be etched to different depths. For example, an etch process commonly referred to as the "Bosch" silicon etch process will etch trenches having wide (W2) openings deeper then trenches having narrow openings (W1). See FIG. 5. Etching trench 130 deeper would result in the structure of FIG. 6. Thus, trenches 125 and 130 may independently extend from 105 to between greater than halfway to and all the way to the bottom surface of substrate 100.

However, if substrate 100 is a silicon-on-insulator (SOI) substrate (i.e., a silicon substrate having a buried oxide layer or BOX layer) with the top surface of the buried oxide layer located a distance D1 from top surface 105 of substrate 100 then trenches 125 and 130 will be etched to the same depth even if a "Bosch" etch process is used since the BOX layer will act as an etch stop. In one example, the BOX layer comprises silicon dioxide.

Trenches 125 and 130 extend into substrate 100 the distance D1 from top surface 105 of the substrate. Trenches 125 have a width W1 and trench 130 has a width W2. W2 is greater than W1. In one example, W1 is about 1 micron to about 3 microns. In one example, W2 is about 3 microns to about 10 microns. In one example D1 is about 50 microns to about 200 microns. In one example W1 is about 2 microns, W2 is about 5 microns and D1 is about 150 microns. Since trenches 125 and 130 may be elongated in and out of the plane of the drawings (i.e., are rectangles when viewed from above), W1 and W2 measure minimum widths of trenches 125 and 130 (i.e, the short side of the rectangle).

Figure 1C:
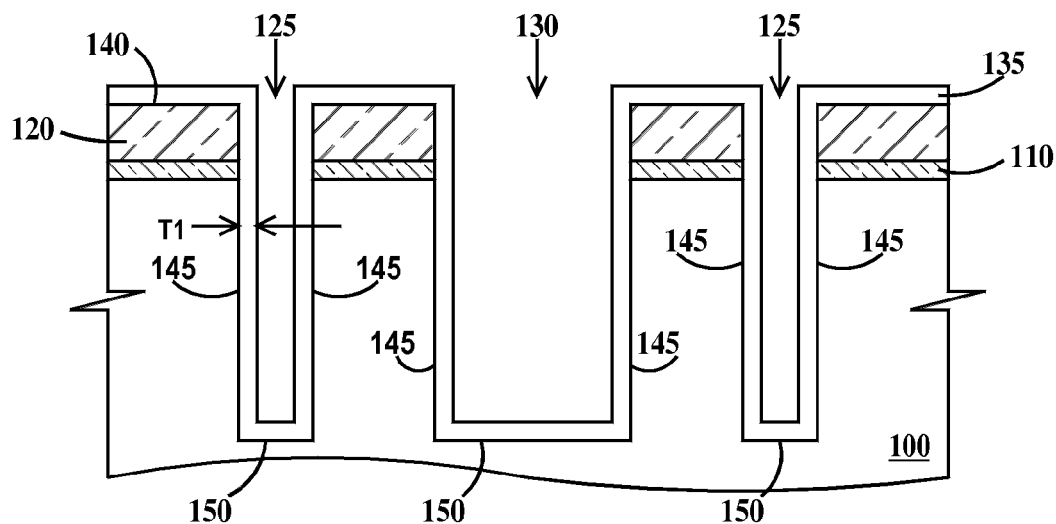

In FIG. 1C, a polysilicon layer 135 is deposited on top surfaces 140 of second dielectric layer 120, sidewalls 145 and bottoms 150 of trenches 125 and 130. In one example, polysilicon layer 135 comprises an N or a P-type doped polysilicon. In one example, polysilicon layer 135 comprises boron doped polysilicon. Polysilicon layer 135 has a thickness T1. In one example, T1 is about 0.8 microns to about 2.4 microns.

Figure 1D:
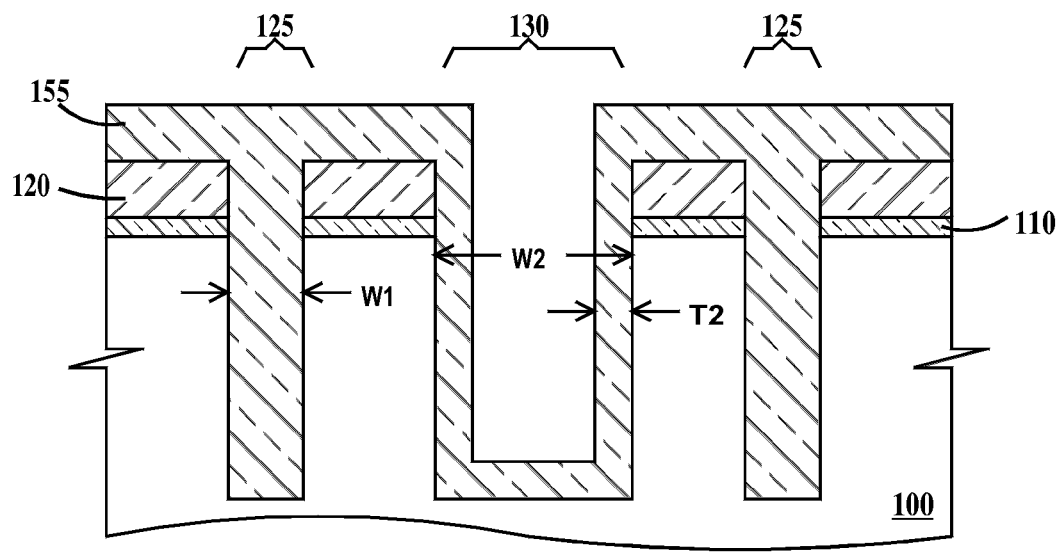

In FIG. 1D an oxidation is performed to convert polysilicon layer 135 (see FIG. 1C) to a silicon dioxide layer 155. Silicon dioxide layer 155 has a thickness T2. Silicon dioxide layer 155 completely fills trenches 125, but does not completely fill trench 130 because the width W2 of trench 130 is greater than twice the thickness T2 of silicon dioxide layer 155. Silicon dioxide layer conformally covers the sidewalls and bottom of trench 130. In one example, T2 is about equal to half of W1.

In one example, the oxidation of polysilicon layer 135 (see FIG. 1C) to form silicon dioxide layer 155 is performed using a high pressure oxidation (HIPOX) process.

HIPOX of boron doped polysilicon (i.e., layer 135 of FIG. 1C) is preferred because of the high oxidation rate of born doped polysilicon and the ability of HIPOX to form uniform oxide thicknesses in deep trenches.

Alternatively, the structure illustrated in FIG. 1D may be formed by oxidation (e.g., in a furnace) of the sidewalls and bottoms of trenches 125 and 130 of FIG. 1B or by deposition (e.g., by chemical vapor deposition (CVD) or atomic layer deposition (ALD)) of oxide on the sidewalls and bottom of trenches 125 and 130. Alternatively, any suitable dielectric, such as silicon nitride, alumina; or combination of multiple dielectrics would be suitable.

Figure 1E:
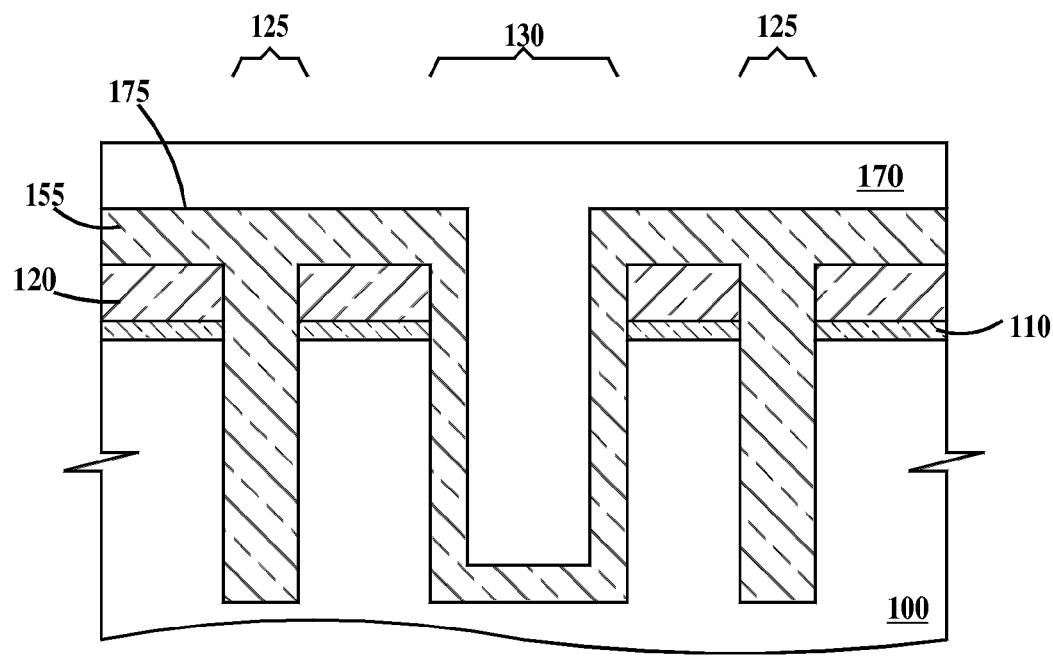

In FIG. 1E, a polysilicon layer 170 is formed top surface 175 of silicon dioxide layer 155 and completely fills the remaining space in trench 130. In one example, polysilicon layer 170 comprises intrinsic (i.e., undoped) polysilicon. In a second example, the polysilicon is in-situ doped, with any known dopant such as phosphorus, arsenic, or boron.

Figure 1F:
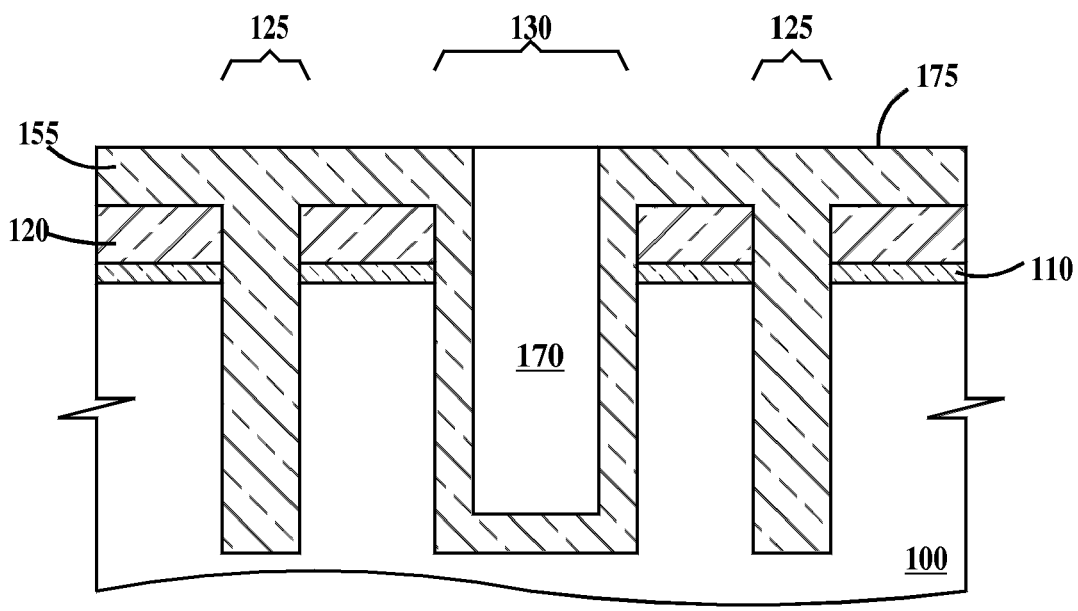

In FIG. 1F, a CMP is performed to remove polysilicon layer 170 from over silicon dioxide layer 155, so top surface 175 silicon dioxide layer 155 is coplanar with a top surface of polysilicon layer 170 in trench 130. Alternatively, any combination of CMP or lithographically patterned etch back process could be employed to planarize the wafer, as known in the art.

Figure 1G:
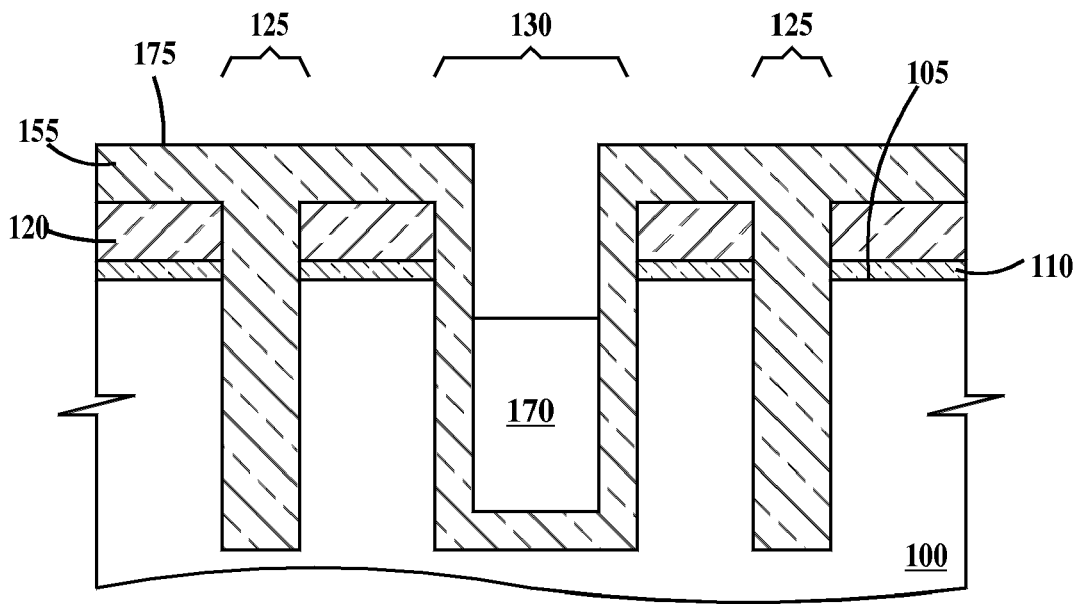

In FIG. 1G, a polysilicon recess process is performed which removes all of polysilicon layer 170 from top surface 175 of dielectric layer 155 and from an upper region of trench 130. A top surface of polysilicon layer 170 remaining in trench 130 after the recess process is below top surface 105 of substrate 100. The polysilicon recess process may be performed using an RIE, a wet etch, or a combination of an RIE etch and a wet etch. In the preferred embodiment, this recess extends below dielectric layer 100, to facilitate the capping of the trench with layer 185, as shown in FIG. 1I.

Figure 1H:
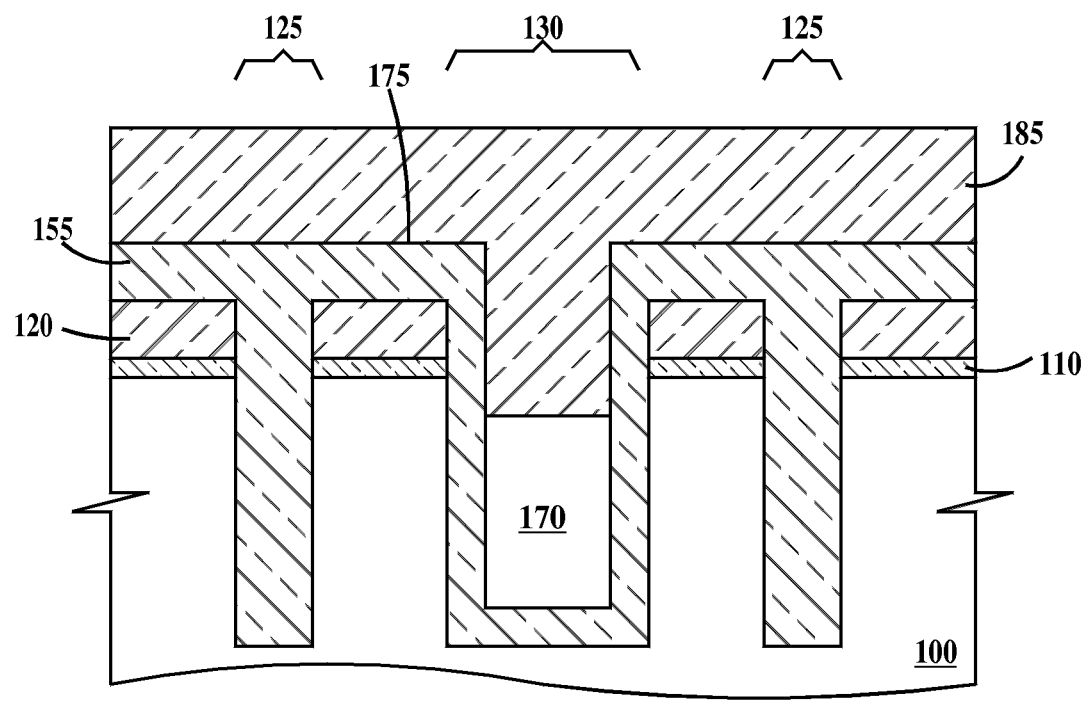

In FIG. 1H, a dielectric layer 185 is formed on top of surface 175 of silicon dioxide layer 155 and in trench 165. Dielectric layer 185 completely fills the space created in trench 130 by the polysilicon recess etch of FIG. 1F. Alternatively, dielectric layer 185 fills the space created in trench 130 such that a void does not extend to the surface 105 after the planarization shown in FIG. 1I. In one example dielectric layer 185 comprises TEOS oxide (i.e., oxide formed by CVD using tetraethoxysilane precursor), silane oxide (i.e., oxide formed by CVD using silane precursor), or any dielectric deposited using LPCVD (i.e., low pressure CVD) or HDPCVD )i.e., high density plasma CVD) or any other known method.

Figure 1I:
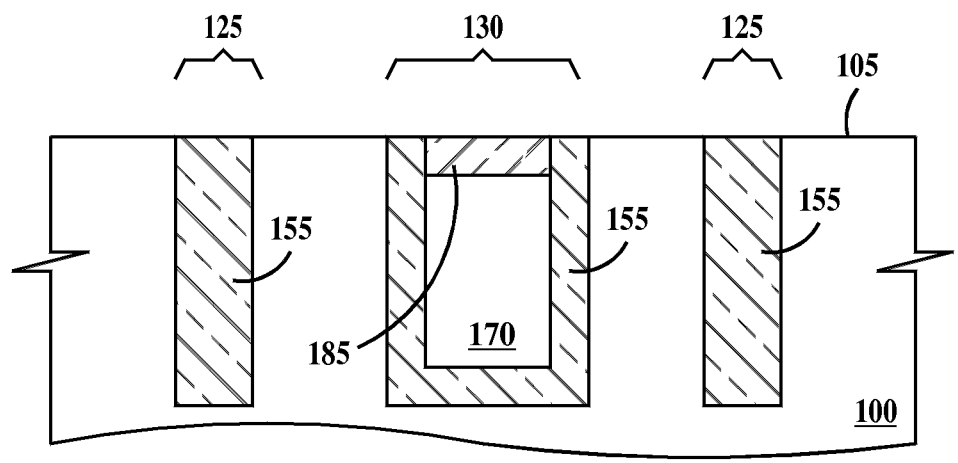

In FIG. 1I, a CMP and/or other etching is performed to remove dielectric layer 185, silicon dioxide layer 155, second dielectric layer 120 from over top surface 105 of substrate 100 leaving a cap of dielectric layer 185 in trench 130. Silicon dioxide layer 155 also remains in trenches 125. After the CMP, top surfaces of silicon dioxide layer 155 in trenches 125, edges of silicon dioxide layer 155 in trench 130, a top surface of dielectric layer 185 in trench, and top surface 105 of substrate 100 are all coplanar or substantially coplanar. Although the complete removal of all layers above substrate 100 is shown, partial removal or selective partial removal may also be performed.

Figure 1J:
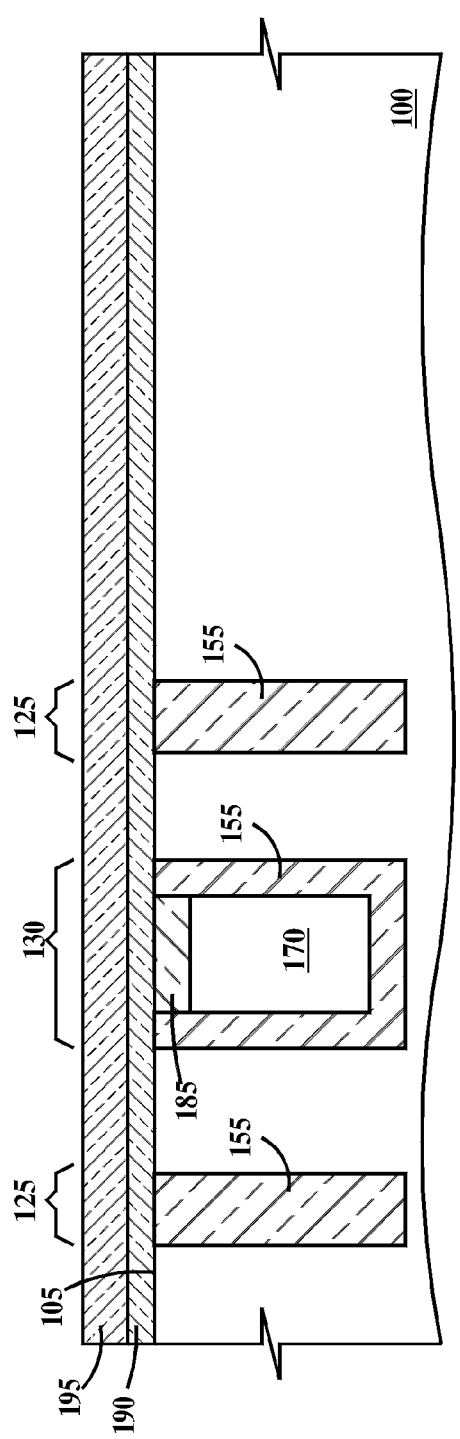

In FIG. 1J, a new first dielectric layer 190 and a new second dielectric layer 195 are formed on top surface 105 of substrate 100. Silicon dioxide layer 155 remains in trenches 125 and silicon dioxide layer 155, polysilicon layer 170 and dielectric layer 185 remain in trench 130 protected by dielectric layers 190 and 195. The purpose of dielectric layers 190 and 195 are to facilitate the formation of integrated circuit structures such as shallow trench isolation (STI), deep trench capacitors, MOSFET transistors, bipolar junction transistors, diodes, varactors, thin film resistors, MOS capacitors, etc. as known in the art. Alternatively, any known set of methods and structures could be employed to form the integrated circuit structures.

Figure 1K:
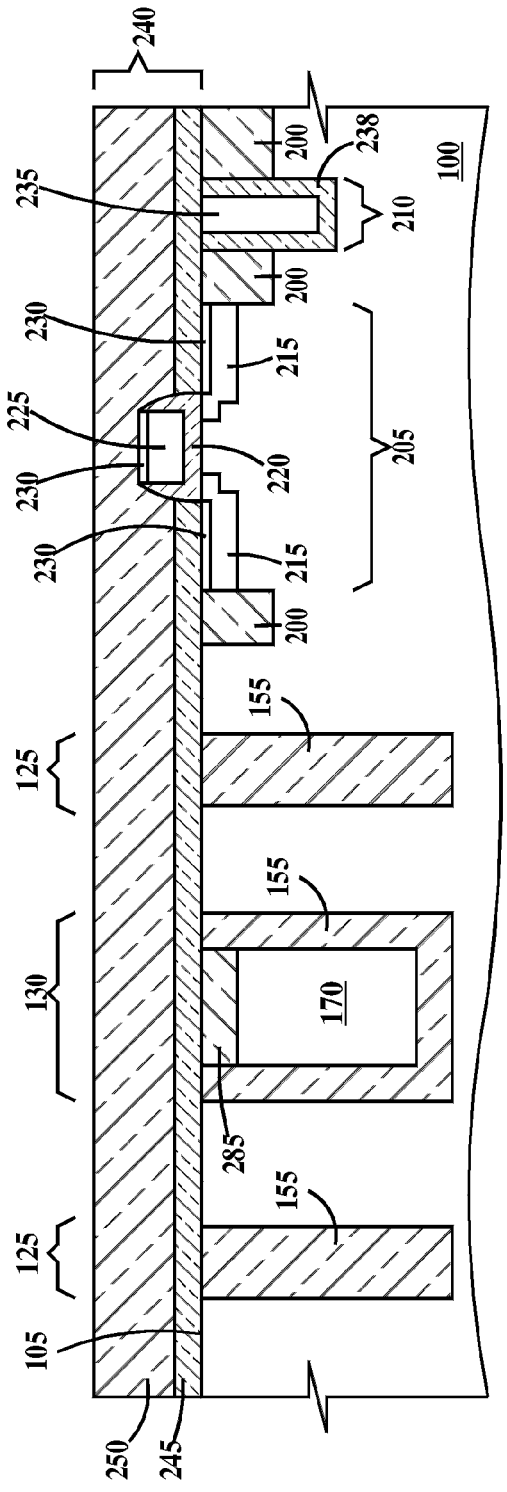

In FIG. 1K, STI 200 has been formed in substrate 100 by a photolithographic/etching process in combination new first and second dielectric layers 190 and 195 (see FIG. 1H) similar to that described supra followed by a TEOS CVD followed by a CMP.

Next, additional photolithographic/etching process/deposition process has been performed to form a FET 205 and a trench capacitor 210. FET 205 and trench capacitor are examples of integrated circuit devices that may be formed at this point in fabrication. Other devices that may be formed at this point include bipolar transistors, BiCMOS SiGe transistors, diodes MOS capacitors, and resistors. FET 205 includes source/drains 215, a gate dielectric 220, a gate electrode 225, and silicide contacts 230. Trench capacitor 210 includes an inner plate 235 and a dielectric layer 238. New first and second dielectric layers 190 and 195 are removed prior to forming gate dielectric layer 220 and an interlevel dielectric layer 240 is formed over top surface 105 of substrate 100 after forming silicide layers 230. Interlevel dielectric layer 240, by way of example, comprises a lower dielectric layer 245 and an upper dielectric layer 250. Interlevel dielectric layer 240 may be a single layer or may include more than two layers. In one example, lower dielectric layer 245 comprises silicon nitride and upper dielectric layer 250 comprises boro-phosphosilicate glass (BPSG).

In FIG. 1K and subsequent FIGS. 1L through 1O, lower dielectric layer 245 is shown as not covering gate 225 of FET 205 for clarity. In actuality, lower dielectric layer 245 covers gate 225 of FET 205 as well.

In FIG. 1L, an opening 255 through lower and upper dielectric layers 245 and 250 over silicide layer 230 of FET 205 is formed using a photolithographic/etching process as described supra.

In FIG. 1M, an electrically conductive stud contact 265 is formed to silicide layer 230 in opening 255 and a protective layer 270 is formed on contact 265 and upper dielectric layer 250. Contact 265 may be formed, for example, by forming an electrically conductive layer (e.g., by evaporation, sputtering or deposition) over upper dielectric layer 250, which completely fills trench 255 and is followed by a CMP. Then protective layer 270 is formed. Contact 265 may independently comprise any of the material combinations described infra for through wafer via core 275 (see FIG. 1O) and through wafer via contact 280 (see FIG. 1O). In one example, protective layer 270 is a dielectric layer. In one example, protective layer 270 comprises silicon nitride.

It should be understood, that many other stud contacts 265 are formed at this time to other devices in substrate 100. It should be understood that many other methods exist for forming and metallizing stud contact 265. It should be understood that there are many methods and structures used to form stud contacts to integrated circuit devices, as known in the art.

In FIG. 1N, an opening 132 is formed through protective layer 270 and upper and lower dielectric layers 245 and 250 over trench 130 using a photolithographic/etching process as described supra. Then, an RIE is performed to remove dielectric layer 185 (see FIG. 1L) from trench 130. Next, a RIE etch, a wet etch or a combination of wet and RIE is used to remove polysilicon layer 170 (see FIG. 1L) from trench 130. Note that, during these polysilicon layer 170 etches, dielectric layer 155 protects substrate 100 (when substrate 100 is silicon) from being etched. To avoid etching substrate 100, opening 132 over trench 130 must not fall outside dielectric layer 155 and, in a preferred embodiment, is aligned such that opening 132 falls inside layer 155 (i.e., when layers 270, 250 and 240 are etched the opening is fully landed on layer 185, see FIG. 1M) such that when polysilicon layer 170 is exposed in opening 132 after layer 185 is etched dielectric layer 155 is not exposed in the opening under polysilicon layer 170 is etched away.

In FIG. 1O, a through wafer via core 275 is formed in trench 130 and an integrally formed (with through wafer via core 275) through wafer via contact 280 is formed in the opening in protective layer 270 (see FIG. 1N) and interlevel dielectric layer 240 over trench 130. Through wafer via core 275 and through wafer via contact 280 may be formed, for example, by forming an electrically conductive layer (e.g., by evaporation, sputtering or deposition) over upper dielectric layer 250 which completely fills trench 130 and the opening in protective layer 270 (see FIG. 1N) and interlevel dielectric layer 240 and is which followed by a CMP. In FIG. 1O, the CMP has completely removed all of protective layer 270 (see FIG. 1N). Alternatively, a thinned layer of protective layer 270 may remain after the CMP. Top surfaces of through wafer via contact 280 and stud contact 265 are coplanar with the top surface of upper dielectric layer 250.

In one example, through wafer via core 275 and through wafer via contact 280 comprise a metal. In one example, through wafer via core 275 and through wafer via contact 280 comprise tungsten (W) or tungsten and titanium nitride (TiN). In one example, through wafer via core 275 and through wafer via contact 280 comprise a first deposited conformal layer of titanium nitride and a second deposited layer of tungsten. In one example, through wafer via core 275 and through wafer via contact 280 comprise a first deposited conformal layer of titanium nitride, a second deposited layer of conformal titanium (Ti) and a third deposited layer of tungsten. Titanium, titanium nitride and tungsten may be deposited using CVD.

In one example, through wafer via core 275 and through wafer via contact 280 comprise tungsten or tungsten and tantalum nitride (TaN). In one example, through wafer via core 275 and through wafer via contact 280 comprise a first deposited conformal layer of tantalum nitride and a second deposited layer of tungsten. In one example, through wafer via core 275 and through wafer via contact 280 comprise a first deposited conformal layer of tantalum nitride, a second deposited layer of conformal tantalum (Ta) and a third deposited layer of tungsten. Tantalum and tantalum nitride and may be deposited using CVD.

Other metallurgical combinations that may be used for through wafer via core 275 and through wafer via contact 280 include combinations of copper (Cu), ruthenium (Ru), Ta and TaN. Those combinations include the following combinations, each of which is in the order of formation: Ta/Cu, TaN/Cu, Ru/Cu, TaN/Ta/Cu/, TaN/Ru/Cu, Ta/Ru/Cu, Ru/Ta/Cu, Ru/TaN/Cu, TaN/Ta/Ru/Cu.

It should be understood that stud contacts 265 may be formed of the same or different materials then through wafer via core 275 and through wafer via contact 280 are formed of. Again, stud contact may be formed of any of the material combinations listed supra for through wafer via core 275 and through wafer via contact 280. It should be understood, that many through wafer vias cores 275 and through wafer via contacts 280 are formed at this time. It should be understood that many other methods exist for forming and metallizing both through wafer via cores 275 and through wafer via contacts 280. For example, electroplated copper could be used in place of tungsten; and tantalum or tantalum nitride could be used in place of titanium nitride. It should be also understood that by thinning substrate 100 from the bottom, a through wafer via will be formed as illustrated in FIGS. 2A through 2J and described infra. Through wafer via core 275 is electrically isolated from substrate 100, by silicon dioxide layer 155. Both through wafer via core 275 and the portions of silicon dioxide layer 155 on the sidewalls of trench 130 will become a conductive through wafer via (through wafer via core 275 being an electrically conductive portion and silicon dioxide layer being a non-conductive portion). Silicon dioxide layers 155 in trenches 125 will become non-conductive through wafer vias.

FIGS. 2A through 2J are cross-sectional drawings illustrating completion of the fabrication of the array of through wafer vias according to embodiments of the present invention and fabrication of a three-dimensional device using arrays of through wafer vias according to embodiments of the present inventions.

Figure 2A:
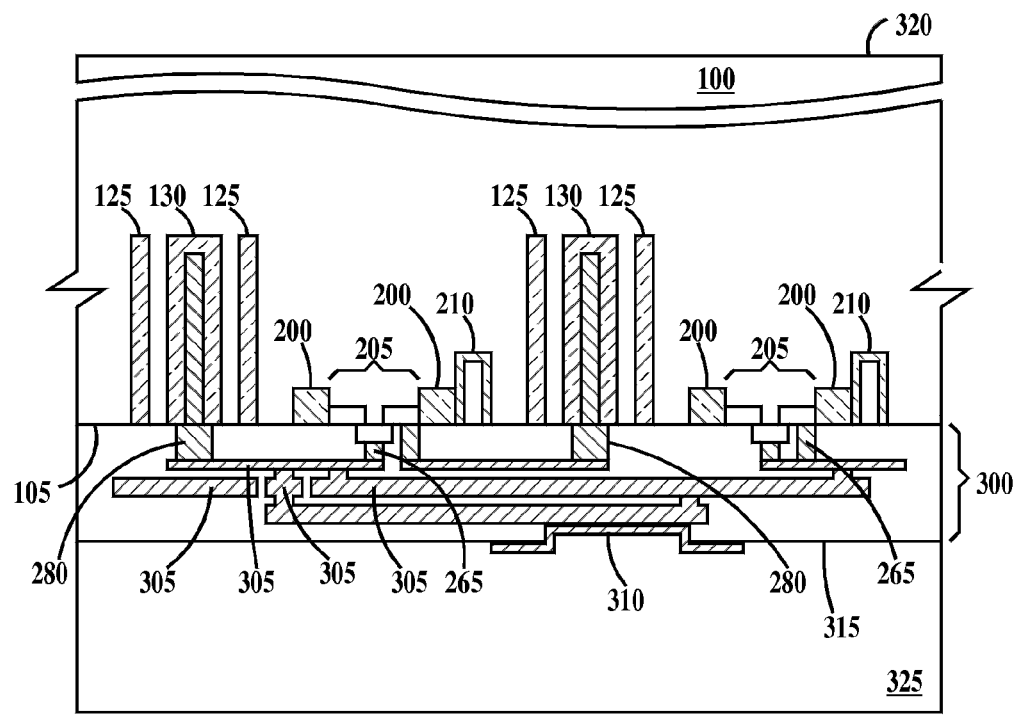
FIGS. 2A through 2J are cross-sectional drawings illustrating completion of the fabrication of the array of through wafer vias according to embodiments of the present invention and fabrication of a three-dimensional device using arrays of through wafer vias according to embodiments of the present inventions.

In FIG. 2A, (not drawn to scale) formed in a set of interlevel dielectric layers 300 are corresponding wires and vias 305. An optional terminal pad 310 is formed on a top surface 315 of the set of interlevel dielectric layers 300 and is in electrical contact with an uppermost wire 305 in an uppermost interlevel dielectric layer of the set of interlevel dielectric layers 300. Wires in a lowermost interlevel dielectric layer of the set of interlevel dielectric layers are in physical and electrical contact with stud contacts 265 and integral contact regions 280. Individual interlevel dielectric layers of the set of interlevel dielectric layers 300 are not illustrated in FIG. 2A. A handle substrate 325 is attached to top surface 315 of the set of interlevel dielectric layers 300. Handle wafer 325 is attached using a layer of adhesive (not shown). In one example, handle substrate 325 is a quartz wafer.

Figure 2B:
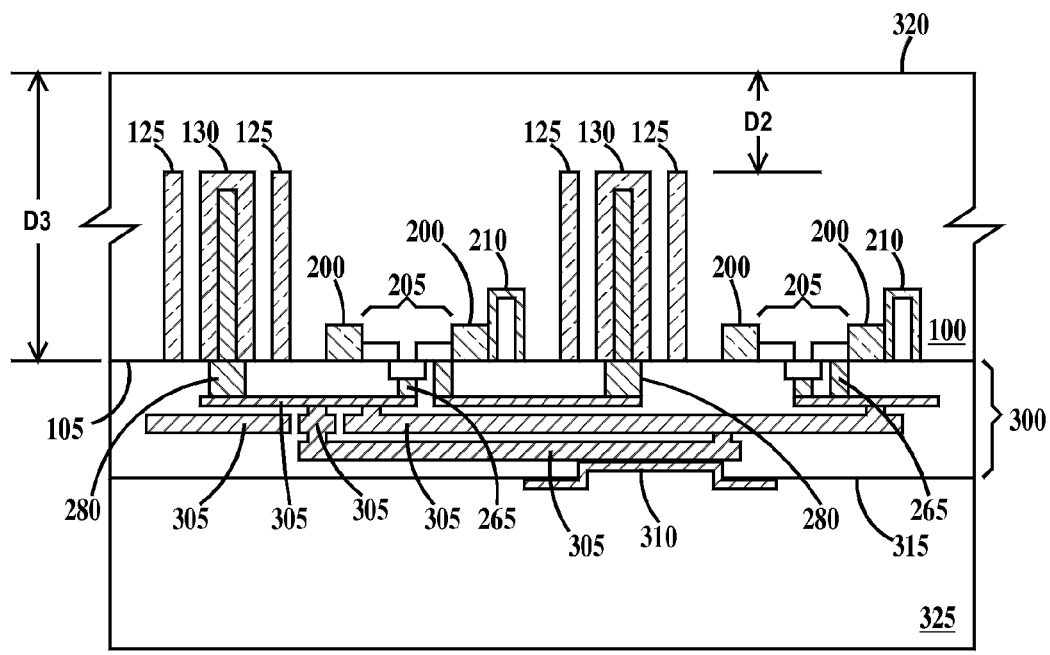

In FIG. 2B, substrate 100 is thinned from the bottom (for example, by grinding) to form a new bottom surface 320 that is a distance D2 from trenches 125 and 130. In one example, D2 is about 5 microns to about 50 microns. In one example, D2 is about 20 microns. After thinning, the thickness of substrate 100 is D3. In one example, D3 is about 50 microns to about 200 microns. In one example, D3 is about 170 microns.

Figure 2C:
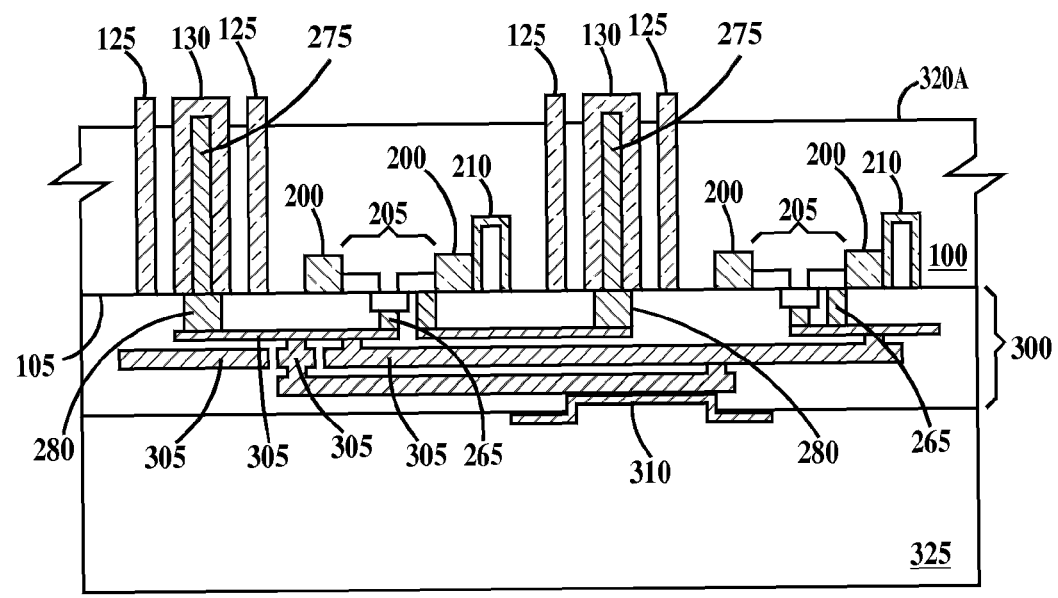

In FIG. 2C, a RIE or wet etch selective to silicon is preformed to recess bottom surface 320 (see FIG. 1B) of substrate 100 so the fill material of trenches 125 and 130 protrudes above a new top surface 320A.

Figure 2D:
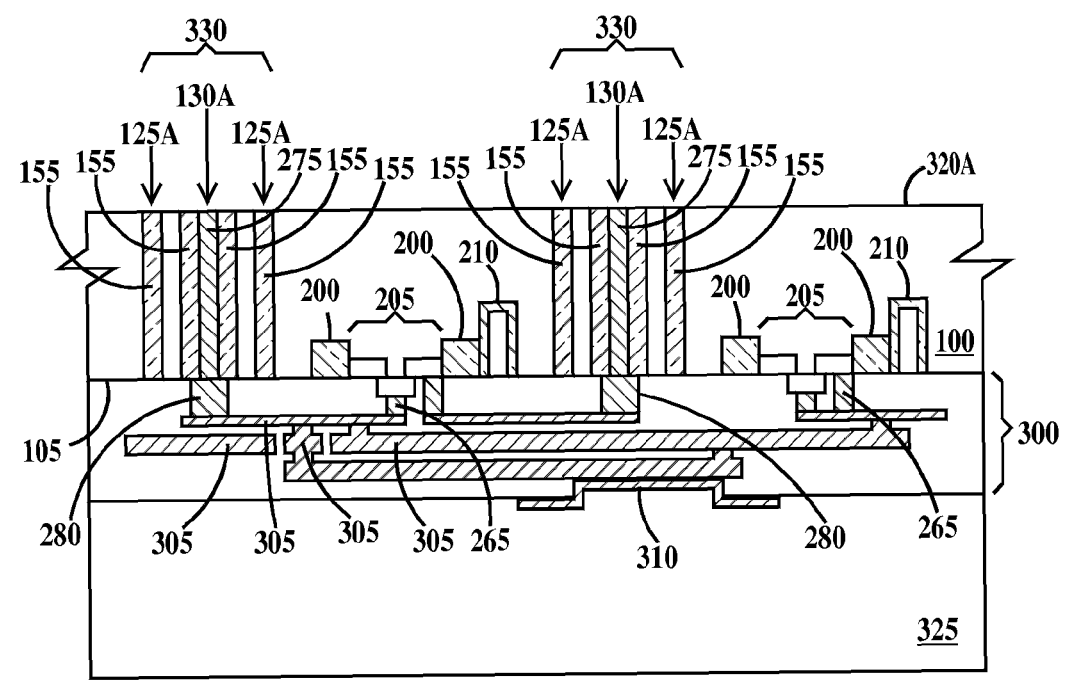

In FIG. 2D, a CMP is performed to remove the fill material protruding above top surface 320A (see FIG. 2C) to form through wafer via arrays 330. In the example of FIG. 2D, each through wafer via array 330 includes two non-conductive through wafer vias 125A and one conductive through via 130A. After the CMP, the electrically conductive through wafer region 275 and silicon dioxide layers 155 (see FIG. 2C) are exposed at bottom surface 320A of substrate 100.

Figure 2E:
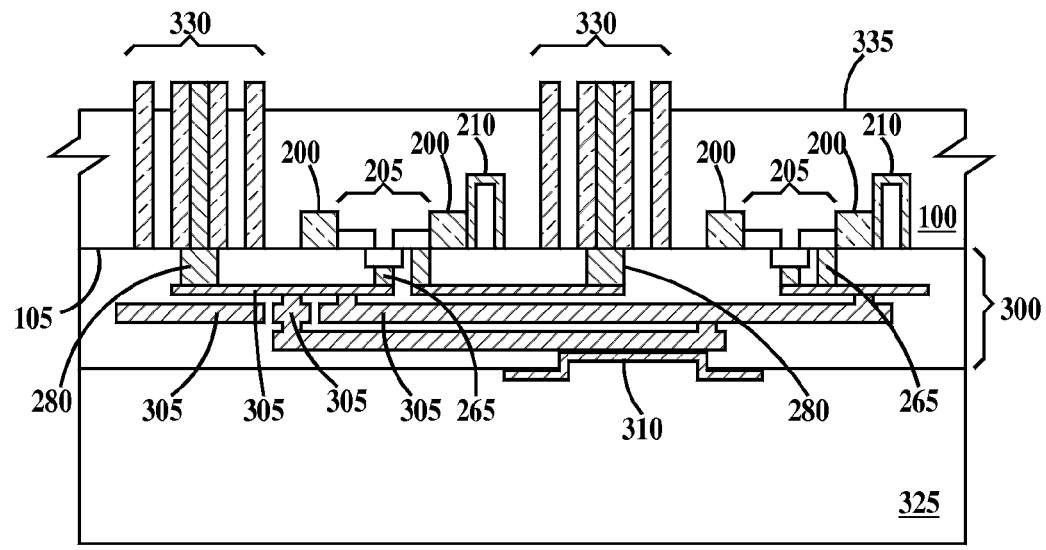

In FIG. 2E, a RIE or wet etch selective to preferentially etch silicon over silicon dioxide is preformed to recess bottom surface 320A (see FIG. 2D) below the bottoms of through wafer via arrays 330 and to form a new bottom surface 335 of substrate 100.

Figure 2F:
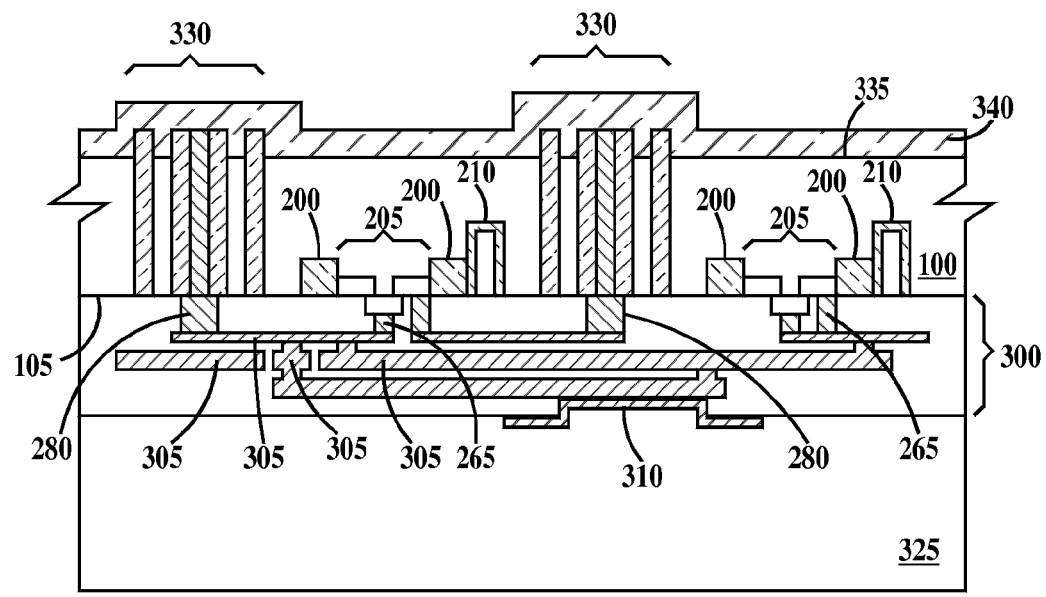

In FIG. 2F, a dielectric layer 340 is formed over bottom surface 335 of substrate and over through wafer via arrays 330. In one example, dielectric layer 340 is a plasma enhanced chemical vapor deposition (PECVD) silicon oxide.

Figure 2G:
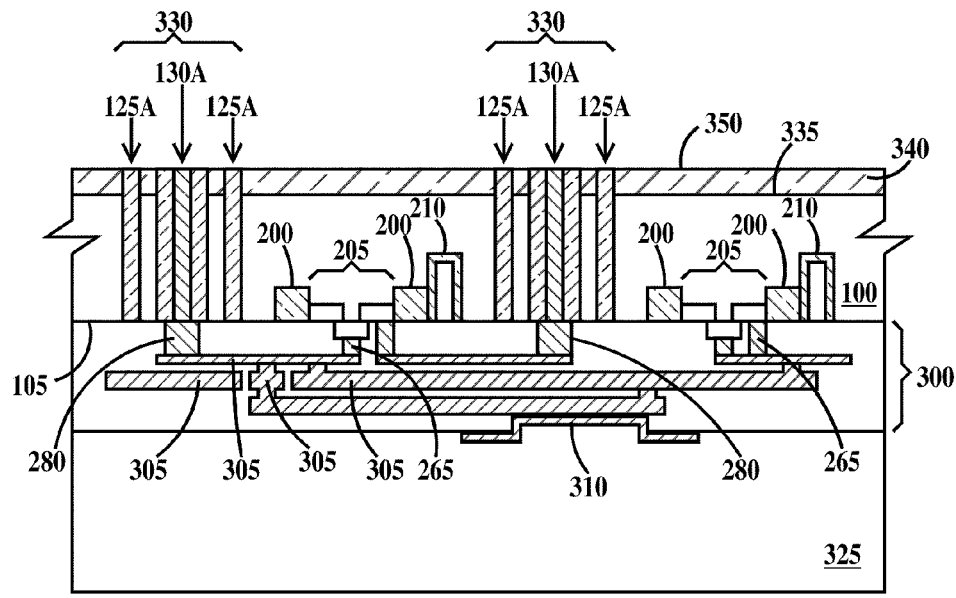

In FIG. 2G, a CMP is performed to remove dielectric layer 340 from over the bottom surfaces of through wafer via arrays 330. Dielectric layer 340 remains on bottom surface 335 of dielectric layer 340 and dielectric layer 340 fills any spaces between through wafer via arrays 330 between individual through wafer vias 125A and 130A of each of the through wafer via arrays. Bottom surfaces of through wafer vias 125A and 130A are coplanar or substantially coplanar with a top surface 350 of dielectric layer 340.

Alternatively, the backside grind process illustrated in FIG. 2B and described supra, can be continued until non-conductive through wafer vias 125A and conductive through wafer vias 130A of FIG. 2D are formed directly (skipping the processes of FIG. 2C) or after grinding and a "clean-up" CMP to remove any grinding damage to the through wafer vias and surface 320A (see FIG. 2D). This alternative is advantageously applied when trenches 125 have not been etched significantly deeper into substrate 100 then trenches 130 (see FIG. 2A). If trenches 130 are etched significantly deeper than trenches 125 (see FIG. 5), then the grinding could expose conductive through via 130A but not non-conductive through vias 125A as illustrated in FIG. 6.

It should be noted that through wafer via 125A comprises a first trench filled only with an insulator and through wafer via 130A comprises a second trench having a filling only consisting of a dielectric liner surrounding an electrically conductive core.

Figure 2H:
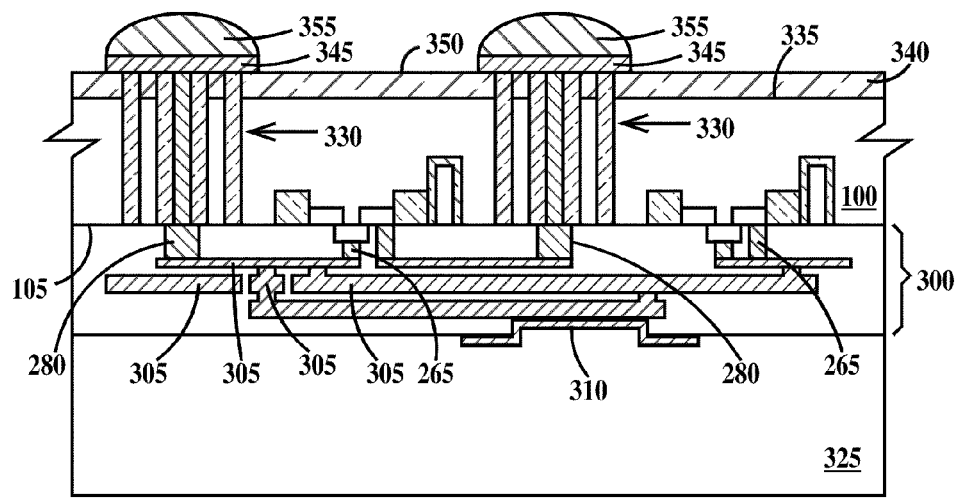

In FIG. 2H, electrically conductive pads 345 are formed on top surface 350 of dielectric layer 340 on through wafer via arrays 330 and electrically conductive solder bumps 355 are formed on pads 345. In one example, pads 345 and solder bumps 355 are formed by electroplating through a patterned photoresist layer or by evaporation through a metal mask. If pads 345 are formed by plating, a thin electrically seed layer is first deposited, which is removed after the photoresist layer is removed, by RIE or wet etching.

Figure 2I:
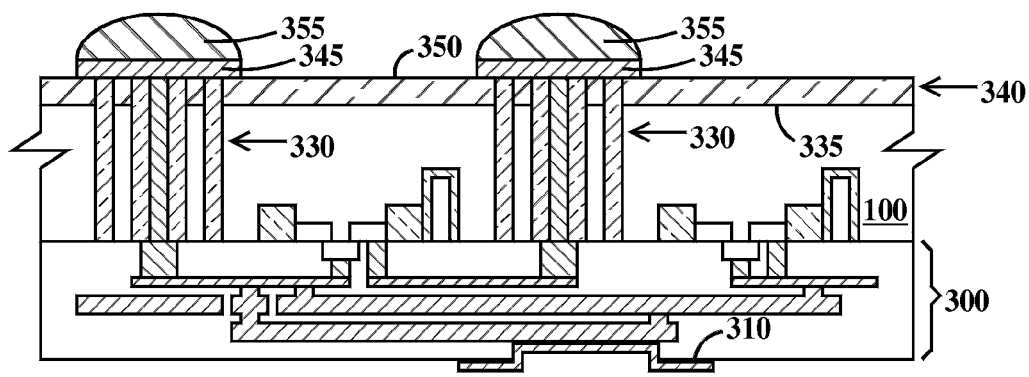

In FIG. 2I, handle wafer 325 (see FIG. 2G) is removed, either prior to or after chip dicing. An exemplary method of removing handle wafer 325 is to expose the adhesive to ultraviolet radiation as is well known in the art. In a preferred embodiment, handle wafer 325 is removed after dicing to minimize the potential for breaking the thinned wafer.

Figure 2J:
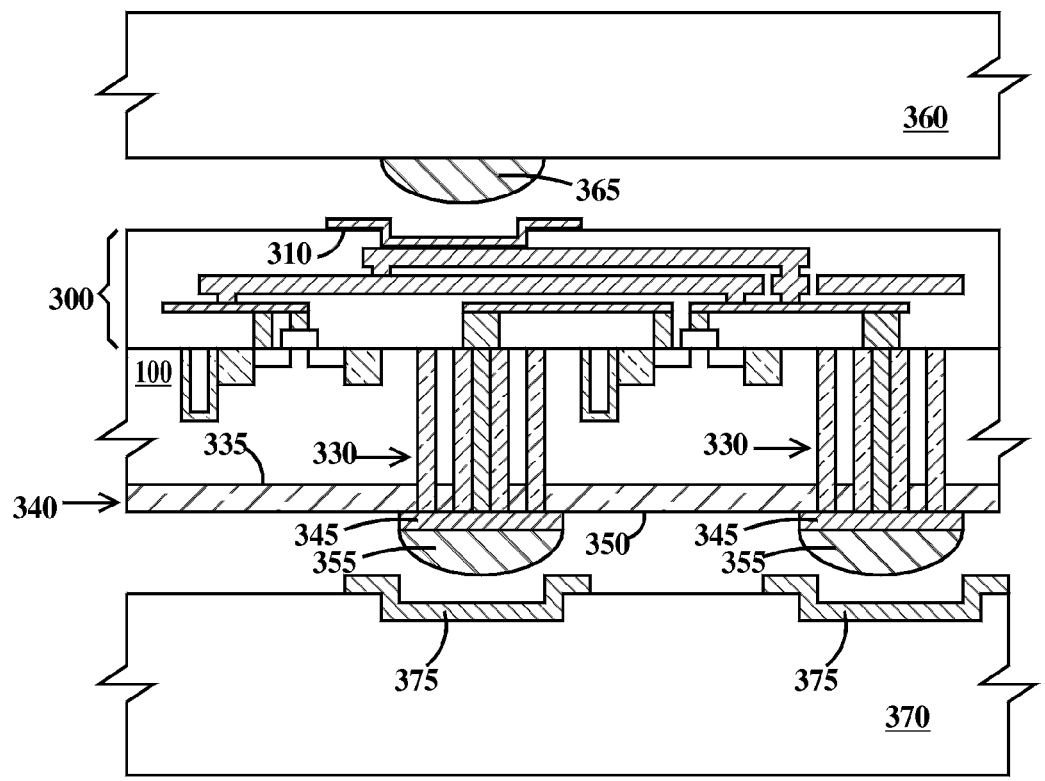

FIG. 2J is an exploded view prior to a solder reflow step. In FIG. 2J, an upper substrate 360 containing electrical components is aligned to terminal pad 310 by electrically conductive solder bumps 365, and substrate 100 is aligned to a lower substrate 370 having electrically conductive pads 375 and containing electrical components (not shown) by solder bumps 355. This arrangement allows for self alignment of the three components prior to the anneal which melts the solder bumps, electrically wires substrates 100, 360 and 370 together and completes the fabrication process. Examples of electrical components include but are not limited to, transistors, diodes, resistors, capacitors, inductors and wires.

While pad to solder bump connections are illustrated in FIG. 2J, other connection types such as pad to pad may be used (i) between substrate 360 and substrate 100, (ii) between substrate 100 and substrate 370 or (iii) between substrate 360 and substrate 100 and between substrate 100 and substrate 370 substrate. While solder bumps are shown on substrate 360 and pads on substrate 100, pads may be formed on substrate 360 and solder bumps on substrate 370. While the solder bumps are shown on substrate 100 and pads on substrate 370, pads may be formed on substrate 100 and solder bumps on substrate 370. Substrate 360 may be replaced with wire or tab bonds. If the solder bumps and pads of substrate 100 are swapped, then substrate 370 may be replaced with wire or tab bonds.

Figure 3A:
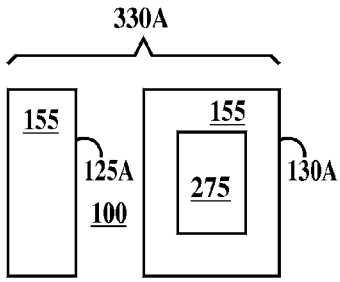
FIGS. 3A through 3D are plan views of through wafer vias according to embodiments of the present inventions.

FIGS. 3A through 3D are exemplary plan views of through wafer vias according to embodiments of the present inventions. In FIG. 3A, a single through wafer via array 330A consists of an electrically non-conductive through wafer via 125A filled with silicon dioxide layer 155 and a single electrically conductive through wafer via 130A consisting of silicon dioxide layer 155 intervening between conductive through via region 275 and substrate 100.

Figure 3B:
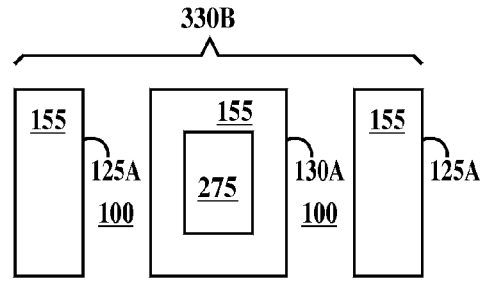

In FIG. 3B, a through wafer via array 330B consists of two electrically non-conductive through wafer vias 125A filled with silicon dioxide layer 155 on opposite sides of electrically conductive through wafer via 130A consisting of silicon dioxide layer 155 intervening between conductive through via region 275 and substrate 100.

Figure 3C:
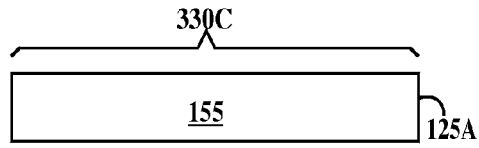
Figure 3C:
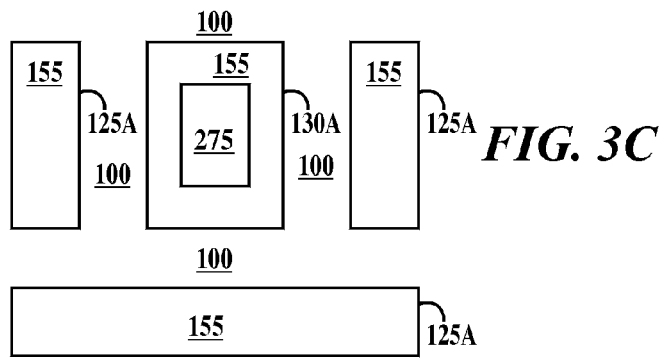

In FIG. 3C, a through wafer via array 330C comprises four electrically non-conductive through wafer vias 125A filled with silicon dioxide layer 155 on opposite each of the four sides of electrically conductive through wafer via 130A consisting of silicon dioxide layer 155 intervening between conductive through via region 275 and substrate 100.

Figure 3D:
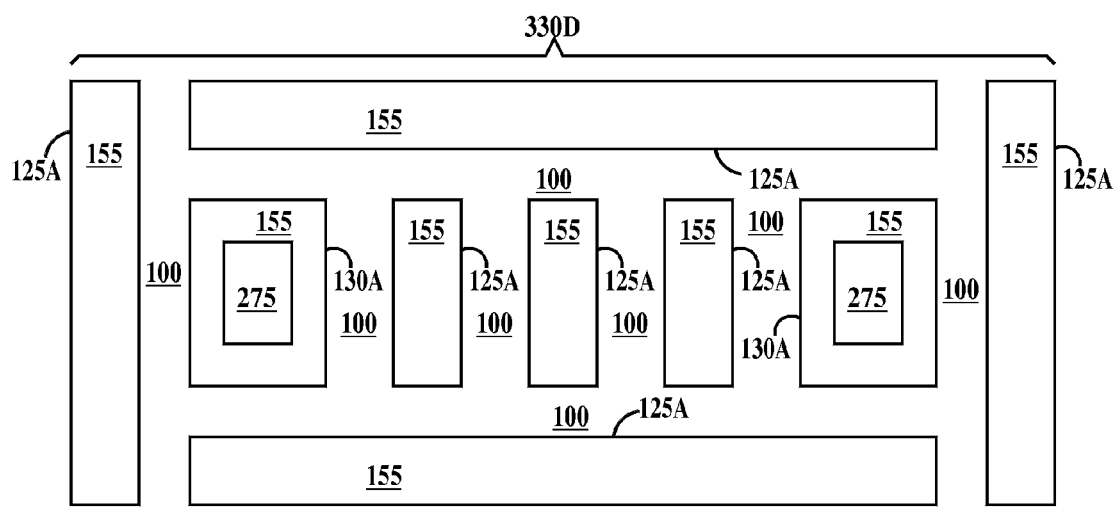

In FIG. 3D, through wafer via array 330C consists of seven electrically non-conductive through wafer vias 125A filled with silicon dioxide layer 155 and two electrically conductive through wafer via 130A consisting of silicon dioxide layer 155 intervening between conductive through via region 275 and substrate 100. Three of through wafer vias 125A are positioned between the two through wafer vias 130A. Four of the through wafer vias 125A are positioned opposite each of the four sides formed by the combination the first three through wafer vias 125A and the two through wafer vias 130. Through wafer vias 330B, 330C and 330D function as coplanar waveguides.

In each of FIGS. 3A, 3B, 3C and 3D every through wafer via 125A and 130A is surrounded by a region of substrate 100. Through wafers vias of the present embodiment of the present invention includes at least one electrically conductive element extending from the top surface of the substrate, through the substrate, to the bottom surface of the substrate and at least one non-electrically conductive (i.e., dielectric or insulator) element also extending from the top surface of the substrate, through the substrate, to the bottom surface of the substrate.

It should be understood that very many other through wafer via arrays having different numbers and configurations of through wafers vias 125A and 130A are possible and are not limited to those illustrated in FIG. 3A, 3B, 3C and 3D.

FIGS. 4A through 4D are schematic plan views of waveguide models using through wafer vias according to embodiments of the present invention. In FIGS. 4A, 4B, 4C and 4D, G indicates an electrical conductor filled trench that is not insulated from the substrate and that is connected to ground, S indicates an electrical conductor filled trench that is not insulated from the substrate and is connected to a signal source, I indicates an electrical insulator filled trench, IG indicates an electrical conductor filled trench connected to ground and that is insulated from the substrate and IS indicates an electrical conductor filled trench connected to a signal source and that is insulated from the substrate. The space between the G, S, I, IG and IS structures is substrate.

The structures of FIG. 4A, 4B, 4C and 4D were modeled as signal waveguides for characteristic impedance, propagation loss and effective dielectric constant (Er). Low propagation loss and small effective dielectric constant are preferred. The model was based on a silicon substrate with a relative dielectric constant of 11.9 and a conductivity of 7.41 Siemens/meter; tungsten with a conductivity of 1.82E7 Siemens/meter for the electrical conductor for the G, IG, S and IS structures; and silicon dioxide with a relative dielectric constant of 4.1 for the insulator of the I, IG and IS structures.

The dimensions of the G and S structures in top view was 50 by 3 microns. The dimensions of the IG and IS structures in top view was 52 by 5 microns (the G and S structures with a surrounding insulator 1 micron thick). The dimensions of the I structures in top view was 52 by 5 microns. Simulation was performed on an Ansoft HFSS-3D full wave EM simulator. Table I gives the result of the simulation for each of the structures of FIGS. 4A, 4B 4C and 4D.

TABLE I

Figure 4A:
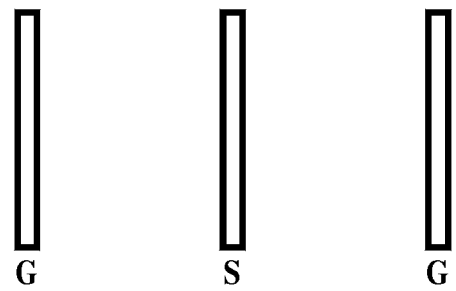
FIGS. 4A through 4D are schematic plan views of waveguide models using through wafer vias according to embodiments of the present invention.
Figure 4B:
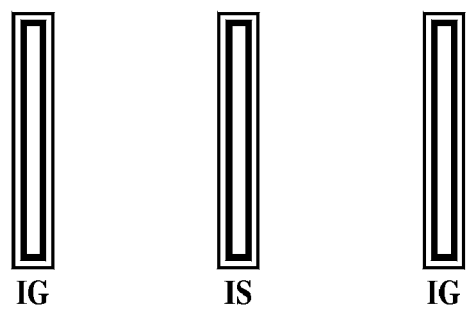
Figure 4C:
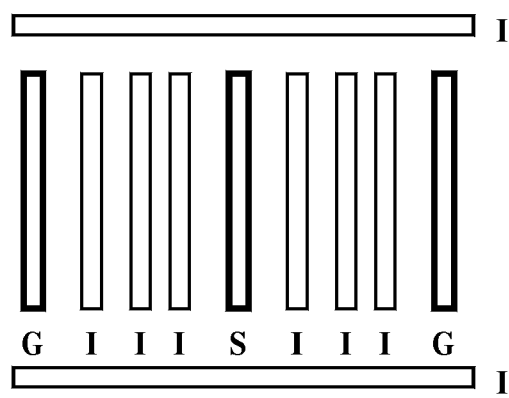
Figure 4D:
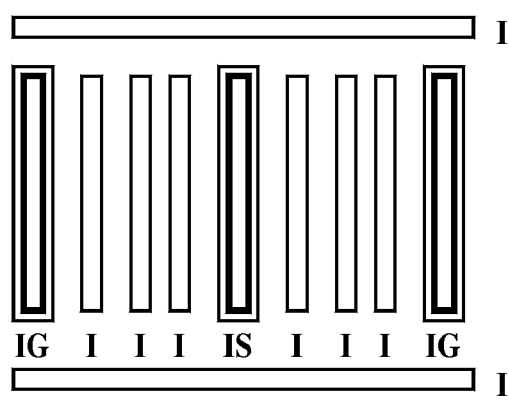

| CASE | Characteristic Impedance | Propagation Loss (dB/mm) | Propagation Loss % of Case 1 | Effective Er |
|---|---|---|---|---|
| FIG. 4A | 22.61 + j0.96 | 1.329 | 100 | 12.136 |
| FIG. 4B | 24.08 + j071 | 1.062 | 79.9 | 10.722 |
| FIG. 4C | 27.07 + j0.37 | 0.777 | 58.5 | 8.4657 |
| FIG. 4D | 28.42 + j0.23 | 0.635 | 47.8 | 7.7056 |

The following conclusions can be reached as a result of the simulation. For coplanar waveguides, insulated through wafer vias have a higher characteristic impedance, less propagation loss, lower effective dielectric constant and is better for signal propagation with less potential un-wanted coupling. The reasons are, silicon is lossy, but silicon dioxide is not. The higher dielectric constant of silicon causes higher parasitic capacitance relative to parasitic capacitance of the lower dielectric constant silicon dioxide.

Thus, a through wafer via that contacts the substrate directly (G structure) as in the embodiments of the present invention, may be used for the ground structure as long as the voltage across the through wafer via is low enough for little or no current is conducted through the substrate. For the signal structure, an insulated conductor (IS structure) such as in the second and third embodiments of the present invention is preferred to reduce signal conduction through the substrate.

Figure 5:
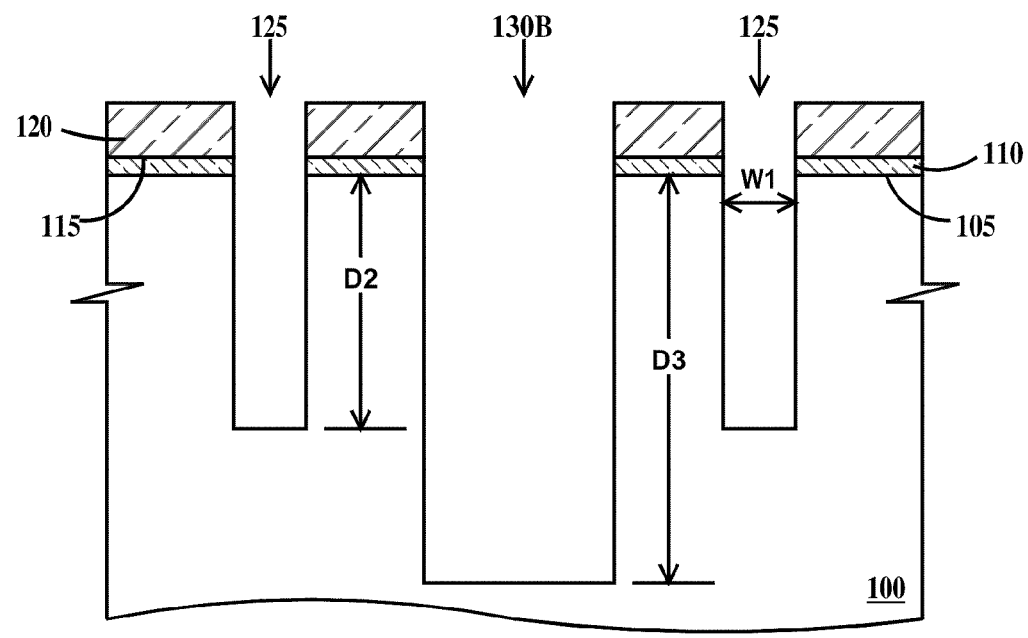
FIG. 5 is a cross-sectional drawing illustrating an alternative structure to that illustrated in FIG. 1B.
Figure 6:
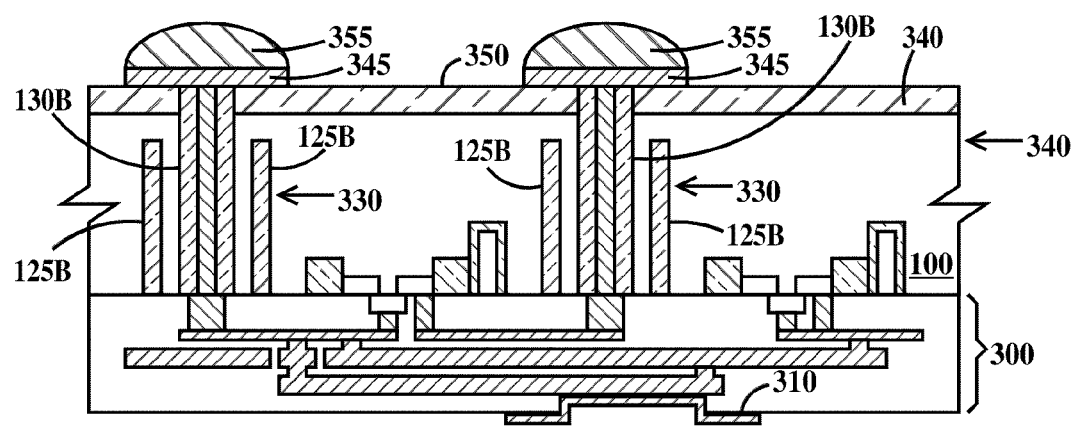
FIG. 6 is a cross-sectional drawing illustrating an alternative structure to that illustrated in FIG. 2I.

FIG. 5 is a cross-sectional drawing illustrating an alternative structure to that illustrated in FIG. 1B. In FIG. 5, trench 130B extend a distance D3 into substrate 100 from top surface 105, while trenches 125 extend into substrate 100 from top surface 105 the distance D2 as described supra with respect to FIG. 1B. D3 is greater than D2, while D2 is equal to D1 (see FIG. 1B).

FIG. 6 is a cross-sectional drawing illustrating an alternative structure to that illustrated in FIG. 2I. The structure of FIG. 6 results if the structure of FIG. 1B is replaced by the structure of FIG. 5. In FIG. 6, conductive through vias 130B contact pads 345 while non-conductive through vias 125B (a misnomer in this case, they are partial-through vias) do not contact pads 345. Regions of substrate 100 and dielectric layer 340 intervene between non-conductive through vias and pad 345.

Thus, the embodiments of the present invention provide a structure and method to integrate through wafer vias into existing integrated circuit fabrication processes having in good propagation of signals from/to the front surface of the integrated circuit chip to/from the bottom surface of the integrated circuit chip.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a semiconductor substrate having a top surface and an opposite bottom surface;
an array of through wafer vias comprising at least one electrically conductive through wafer via and at least one electrically non-conductive through wafer via, each through wafer via of said array of through wafer vias independently extending from said top surface of said substrate to between greater than halfway to and all the way to said bottom surface of said substrate, said at least one electrically conductive through wafer via electrically isolated from all of said semiconductor substrate; and
wherein there is no independent island of semiconductor substrate material between said at least one electrically conductive through wafer via and said semiconductor substrate.

2. The structure of claim 1, wherein said at least one electrically non-conductive via comprises a first trench filled only with an insulator and said at least one electrically conductive via comprises a second trench having a filling only consisting of a dielectric liner surrounding an electrically conductive core.

3. The structure of claim 2, wherein said core comprises (i) tungsten, (ii) copper, (iii) tungsten in combination with titanium, titanium nitride or titanium and titanium nitride, (iv) tungsten in combination with tantalum and tantalum nitride, (v) copper in combination with one or more of titanium, titanium nitride and ruthenium, or (vi) copper in combination with one or more of tantalum, tantalum nitride and ruthenium.

4. The structure of claim 2, further including:
an electrically conductive stud contact in contact with said at least one conductive through wafer via at said top surface of said substrate; and
an electrically conductive backside pad in physical and electrical contact with said at least one conductive through wafer, said backside pad proximate to said bottom surface of said substrate.

5. The structure of claim 4, wherein said backside pad is in physical contact with said at least one non-conductive through wafer via.

6. The structure of claim 4, further including, an insulating layer on said bottom surface of said substrate, said at least one electrically conductive through wafer via and said at least one electrically non-conductive through wafer via extending through said insulating layer, said backside pad on said insulating layer.

7. The structure of claim 4, wherein said stud contact is integrally formed with said electrically conductive core.

8. The structure of claim 4, further including:
a set of wiring levels formed over said top surface of said substrate;
an electrically conductive frontside pad on a top surface of said wiring levels, said frontside pad electrically connected to said stud contact by wires in said set of wiring levels.

9. The structure of claim 8, further including:
(i) a solder bump on said backside pad, (ii) a solder bump on said frontside pad, or (iii) a first solder bump on said backside pad and a second solder bump on said frontside pad.

10. The structure of claim 1, further including:
one or more devices formed at least partially in said substrate;
said one or more devices selected from the group consisting field effect transistors, bipolar transistors, BiCMOS SiGe transistors, diodes, resistors and capacitors.

11. A method, comprising:
forming an array of through wafer vias comprising at least one electrically conductive through wafer via and at least one electrically non-conductive through wafer via through a semiconductor substrate having a top surface and an opposite bottom surface, each through wafer via of said array of through wafer vias independently extending from said top surface of said substrate to between greater than halfway to and all the way to said bottom surface of said substrate, said at least one electrically conductive through wafer via electrically isolated from all of said semiconductor substrate; and
wherein there is no independent island of semiconductor substrate material between said at least one electrically conductive through wafer via and said semiconductor substrate.

12. The method of claim 11, wherein said at least one electrically non-conductive via comprises a trench filled only with an insulator and said at least one electrically conductive via comprises a trench having a filling only consisting of a dielectric liner surrounding an electrically conductive core.

13. The method of claim 12, further including:
forming an electrically conductive stud contact to said core;
forming an insulating layer on said bottom surface of said substrate; and
forming an electrically conductive backside pad on said insulating layer, said at least one electrically conductive through wafer via and said at least one electrically non-conductive through wafer via extending through said insulating layer, said backside pad in physical and electrical contact with said core and in physical contact with said dielectric liner and said insulator.

14. A method, comprising:
(a) forming a first trench and a second trench in a semiconductor substrate, said first and second trenches independently extending from a top surface of said substrate toward an opposite bottom surface of said substrate a distance less than a thickness of said substrate;
(b) simultaneously completely filling said first trench with a dielectric material and forming a liner of said dielectric material on sidewalls of said second trench;
(c) filling remaining space in said second trench with an electrically conductive material, and
(d) thinning said substrate from said bottom surface of said substrate to form a new bottom surface of said substrate, said dielectric material of said first trench and said liner and electrically conductive material of said second trench exposed in said new bottom surface of substrate, wherein there is no independent island of semiconductor substrate material between said electrically conductive material of said second trench and said liner of said dielectric material of said seconds trench.

15. The method of claim 14, wherein (b) includes:
forming a layer of polysilicon on sidewalls of said first trench and on said sidewalls of said second trench; and oxidizing said polysilicon layer to form said dielectric material in said first trench and said liner of said dielectric material on said sidewalls of said second trench.

16. The method of claim 14, wherein said polysilicon is doped with boron.

17. The method of claim 14, further including, between (b) and (c):
   (i) filling remaining space in said second trench with polysilicon;
   (ii) recessing said polysilicon below said top surface of said substrate;
   (iii) filling said trench above said polysilicon with an additional dielectric material; and
   (iv) removing said polysilicon and said additional dielectric material from said second trench.

18. The method of claim 17, further including, between (iii) and (iv):
   forming one or more devices at least partially in said substrate;
   forming an interlevel dielectric layer on said top surface of said substrate;
   forming a first opening through said interlevel dielectric layer to said additional dielectric material and forming a second opening through said interlevel dielectric layer to at least one of said one or more devices; and
   wherein (c) simultaneously fills said second trench, said first opening and second opening.

19. The method of claim 18, wherein said one or more devices is selected from the group consisting field effect transistors, bipolar transistors, BiCMOS SiGe transistors, diodes, resistors and capacitors.

20. The method of claim 14, further including, between (c) and (d):
   forming a set of wiring levels over said top surface of said substrate; and
   forming an electrically conductive frontside pad on a top surface of said wiring levels, said frontside pad electrically connected to said stud contact by wires in said set of wiring levels.

21. The method of claim 20, further including:
   (e) forming an electrically conductive backside pad in physical and electrical contact with said electrically conductive material of said second trench, said backside pad proximate to said bottom surface of said substrate.

22. The method of claim 21, wherein said backside pad is in physical contact with said dielectric material of said first trench.

23. The method of claim 21, further including, between (d) and (e):
   forming an insulating layer on said bottom surface of said substrate, said dielectric material of said first trench extending through said insulating layer and said liner and said electrically conductive material of said second trench extending through said insulating layer, said backside pad formed on said insulating layer.

24. The method of claim 21, further including:
   (i) forming a solder bump on backside pad, (ii) forming a solder bump on said frontside pad, or (iii) forming a first solder bump on backside pad and forming a second solder bump on said frontside pad.

25. The method of claim 14, wherein (d) includes:
   grinding said bottom surface of said substrate to form a new bottom surface of said substrate;
   chemically etching said new bottom surface of said substrate to expose said dielectric material of said first trench and said liner of said second trench; and
   chemical-mechanical-polishing to expose said electrically conductive material of said second trench.

26. A signal transmission line through a semiconductor substrate, said substrate having a top surface and an opposite bottom surface, comprising:
   a conductive through via extending from said top surface of said substrate to said bottom surface of said substrate, sidewalls of said conductive through via electrically insulated from all of said substrate, wherein there is no independent island of semiconductor substrate material between said at least one electrically conductive through wafer via and said semiconductor substrate; and
   a non-conductive through via extending greater than halfway or all the way from said top surface to said bottom surface of said substrate, said nonconductive through via proximate to and separated from said conductive through wafer by a region of said substrate.

27. The signal transmission line of claim 26, further including;
   an additional non-conductive through via extending greater than halfway or all the way from said top surface to said bottom surface of said substrate, said additional non-conductive through via disposed on an opposite side of said conductive through via from said non-conductive through via, said additional nonconductive through via proximate to and separated from said conductive through wafer by an additional region of said substrate.

28. The signal transmission line of claim 26, further including:
   first, second and third additional non-conductive through vias extending greater than halfway or all the way from said top surface to said bottom surface of said substrate, said non-conductive through via and said first, second and third additional non-conductive through vias disposed on respective first, second, third and fourth sides of said conductive through via, said first side opposite said second side, said third side opposite said fourth side; said first, second and third additional non-conductive through vias separated from said conductive through region by respective first, second and third additional regions of said substrate.

29. The signal transmission line of claim 26, further including:
   an additional conductive through via extending from said top surface of said substrate to said bottom surface of said substrate, sidewalls of said additional conductive through via electrically insulated from said substrate;
   one or more interior non-conductive through vias extending greater than halfway or all the way from said top surface to said bottom surface of said substrate, said one or more interior non-conductive through vias intervening between said conductive through via and said additional conductive through via, said one or more interior non-conductive through vias on an opposite side of said conductive through via from said non-conductive through via;
   an additional non-conductive through via extending greater than halfway or all the way from said top surface to said bottom surface of said substrate, said additional non-conductive through via disposed on an opposite side of said additional conductive through via from said one or more interior non-conductive through vias; and
   first and second exterior non-conductive through vias extending greater than halfway or all the way from said top surface to said bottom surface of said substrate, said first and second exterior non-conductive through vias disposed on different sides of a core group consisting of said conductive through via, said one or more interior non-conductive through vias and said additional conductive through via.

30. The signal transmission line of claim 26, further including:
- first and second additional conductive through vias extending greater than halfway or all the way from said top surface to said bottom surface of said substrate, sidewalls of said additional conductive through via electrically insulated from said substrate, said first additional conductive through via between said conductive through via and said second additional conductive through via;
- first one or more interior non-conductive through vias extending greater than halfway or all the way from said top surface to said bottom surface of said substrate, said first one or more non-conductive through vias and said non-conductive through via intervening between said conductive through via and said first additional conductive through via;
- second one or more interior non-conductive through vias extending greater than halfway or all the way from said top surface to said bottom surface of said substrate, said second one or more non-conductive through vias intervening between said first additional conductive through via and said second additional conductive through via; and
- first and second exterior non-conductive through vias extending from said top surface of said substrate to between greater than halfway to and all the way to said bottom surface of said substrate, said first and second exterior non-conductive through vias disposed on different sides of a core group consisting of said conductive through via, said first one or more interior non-conductive through vias, said second one or more interior non-conductive through vias, and said non-conductive through via.

* * * * *